United States Patent [19]
Ueuchi et al.

[11] Patent Number: 6,013,938
[45] Date of Patent: Jan. 11, 2000

[54] POWER CONTROL DEVICE

[75] Inventors: Gen Ueuchi, Yamatotakada; Hideyuki Imanaka, Yoshino-gun; Hirofumi Tsunano, Yamatotakada, all of Japan

[73] Assignee: Sharp Kabushiki Kaisha, Osaka, Japan

[21] Appl. No.: 08/896,086

[22] Filed: Jul. 17, 1997

[30] Foreign Application Priority Data

Jul. 19, 1996 [JP] Japan ..................................... 8-191017
May 30, 1997 [JP] Japan ..................................... 9-142658

[51] Int. Cl.$^7$ ................................................. H01L 29/00
[52] U.S. Cl. ........................... 257/529; 257/621; 257/622
[58] Field of Search .................................. 257/529, 621, 257/622

[56] References Cited

U.S. PATENT DOCUMENTS

| | | | |
|---|---|---|---|
| 4,045,310 | 8/1977 | Jones et al. | 257/529 |
| 4,413,272 | 11/1983 | Mochizuki et al. | 257/529 |
| 4,635,091 | 1/1987 | Roger | 257/529 |
| 4,738,933 | 4/1988 | Richards . | |
| 4,811,080 | 3/1989 | Richards . | |
| 5,050,043 | 9/1991 | Schnabel . | |
| 5,250,821 | 10/1993 | Ferla et al. | 257/181 |
| 5,331,195 | 7/1994 | Yukihiro . | |
| 5,376,815 | 12/1994 | Yokota et al. | 257/341 |
| 5,376,820 | 12/1994 | Crafts et al. | 257/529 |
| 5,587,598 | 12/1996 | Hatanaka | 257/529 |
| 5,780,918 | 7/1998 | Aoki | 257/529 |

FOREIGN PATENT DOCUMENTS

| | | |
|---|---|---|
| 63-240054 | 10/1988 | Japan . |
| 63-308361 | 12/1988 | Japan . |
| 5-274994 | 10/1993 | Japan . |
| 9-17872 | 1/1997 | Japan . |

*Primary Examiner*—J. Carroll
*Attorney, Agent, or Firm*—Nixon & Vanderhye, P.C.

[57] ABSTRACT

Providing a power control device of a simple structure which increases the reliability of a circuit as incorporated therein. A semiconductor component constituting a power control device comprises a semiconductor chip, atop of which a cathode and a gate are formed via an oxide film portion. The cathode comprises a pad portion, a fusion portion and a contact portion. The pad portion and the contact portion are interconnected by the fusion portion only. An anode is formed at the bottom of the semiconductor chip. With the flow of a fusing current through the fusion portion, the fusion portion is fused by heat generated therefrom whereby the current flow through the cathode and the anode is interrupted.

14 Claims, 12 Drawing Sheets

POWER CONTROL DEVICE

BACKGROUND OF THE INVENTION

1. Field of the Invention

The present invention relates to a medium- to large-current power control device such as thyristors, TRIACs and the like.

2. Description of the Related Art

The power control devices, such as thyristors, TRIACs and the like, are preferably utilized as switches for hot-water supply systems. For example, a thyristor is a semiconductor device having three terminals of anode, cathode and gate. The semiconductor device operates as a switching element adapted to allow or prohibit a flow of current between the cathode and anode based on the current flow through the gate.

FIG. 14A is a front view for illustrating a typical power control device 1 whereas FIG. 14B is a side view thereof. A semiconductor component 3 is secured to a metal base 2 at the center thereof, and connected to terminals 4a and 4b. The semiconductor component 3 has its bottom surface bonded to the base 2 by soldering and its top surface connected to the terminals 4a and 4b via a wire 5. These are covered by a package formed of a synthetic resin material so as to form the power control device 1.

FIGS. 15 and 16 illustrate a first example of the prior art. FIG. 15 is a circuit diagram showing a circuit 11 employing the power control device 1. FIG. 16A is a plan view showing the semiconductor component 3 constituting the power control device 1 whereas FIG. 16B is a sectional view thereof taken on line 16B—16B in FIG. 16A. FIG. 16 illustrates an electrode configuration of the semiconductor component 3, in particular. The semiconductor component 3 of this configuration constitutes the power control device 1. The circuit 11 employing this power control device 1 is shown in FIG. 15. The circuit 11 includes a SSR (Solid State Relay) 12 comprised of a combination of multiple types of power control devices such as thyristors, TRIACs and the like. The circuit 11 is adapted to control heat generated by a load 13 by means of the SSR 12.

In some cases, an abrupt upsurge in current, such as caused by rush current, lightning surge or the like, may occur in the circuit including the power control device 1. Such a current is generally referred to as the surge current. A flow of the surge current may cause forward secondary breakdown which destroys a p-n junction of the semiconductor component 3 in the power control device 1. The power control device 1 guarantees to withstand the surge current of about 10 to 40 times the normal rated current by employing an electrode for semiconductor component 3, a semiconductor component 3 and a wire 5 for connection of terminals 4a and 4b, which are fully capable of withstanding the surge current.

As seen in FIG. 15, the circuit 11 incorporates a fuse 14 as an external element of the SSR 12. There is selected a fuse 14 such as to be fused when a fusing current of above a predetermined current value flows therethrough. The predetermined current value is greater than a withstand surge current of the power control device 1 constituting the SSR 12 and smaller than a current value at which the semiconductor component 3 in the power control device 1 is destroyed. When a current of above the withstand surge current flows through the circuit 11, the fuse is burnt even after the semiconductor component 3 is destroyed, so that the current flow through the circuit 11 is interrupted. This prevents the load 13 from generating excessive heat for assurance of safety.

Next, description will be given on the electrode configuration of the semiconductor component 3 constituting the power control device 1. As seen in FIGS. 16A and 16B, the top surface of a semiconductor chip 22 is masked by a masking oxide film 23 formed with contact windows for allowing electrodes to contact the semiconductor chip 22. The respective windows are filled with aluminum so as to define a cathode 24 and a gate 25. The cathode 24 and the gate 25 contact the semiconductor ship 22 at their respective portions occupying the windows. The bottom surface of the semiconductor chip 22 is covered by an anode 26 formed of a solderable metal (e.g., Ti—Ni alloy or the like). In the semiconductor component 3 of this configuration, the cathode 24 and gate 25 contact the semiconductor chip 22 at their respective bottom surfaces and have their respective top surfaces subjected to wire bonding.

In the power control device 1 comprising the semiconductor component 3 as shown in FIG. 16 is provided the cathode electrode 24 having a sufficient thickness and width in consideration of the maximum ratings and reliability of the device. This provides for the prevention of voltage drop caused by the cathode 24 serving as an interconnection resistance or fusions caused by the surge current and electromigration. Particularly, there is defined a maximum possible contact area on which the cathode 24 contacts the semiconductor chip 22. Additionally, the wire 5 has a sufficiently large sectional area for withstanding the surge current.

According to a second example of the prior art (not shown), the fuse is replaced by a wire interconnecting the semiconductor component and external terminals, which also serves as a fusion portion. More specifically, the wire size is adjusted such that the wire is fused when a fusing current exceeding a predetermined current value flows therethrough. Thus, with the flow of the fusing current, the wire is fused before the semiconductor component of the power control device breaks down, thereby shutting down the current flow through the semiconductor component.

However, in case where the power control device is utilized as a switching device for the circuit, the circuit employing the fuse as the external element, like the first example of the prior art, results an increased scale and cost.

On the other hand, the following problems 1 to 5 exist with the second example of the prior art wherein the wire also serves as the fusion portion.

(1) The definition of a desired value of fusing current requires the selection of a suitable wire from those of various sizes based on the characteristics of each semiconductor component and hence, additional effort and cost must be paid.

(2) A thinned long wire suffers a significant voltage drop produced therein. Hence, it is uneconomical to employ such a long, thin wire for forming the power control device for use in the circuit.

(3) Difference in the pressure applied during the wire bonding results in deformation of wires which varies the predetermined fusing current and hence, the reliability of the power control device is decreased.

(4) Heat generated from the fusion of the wire is instantaneously conducted to the semiconductor component via the wire, so that the semiconductor component may sometimes be expanded to rupture and hence, the semiconductor component becomes disabled to provide the normal operation.

(5) As to a semiconductor chip having a large electrode and a wire of a large sectional area for use in large-current apparatuses, it is difficult to adjust the wire size to a desired value of fusing current.

SUMMARY OF THE INVENTION

It is therefore, an object of the invention to provide a power control device of a simple structure which contributes to enhancement of reliability of a circuit as incorporated therein.

The invention provides a power control device in response to a control signal from an external source for controlling a current flowing between two electrodes formed on a semiconductor chip, the power control device comprising a fusion portion to be fused by the flow of a greater than predetermined level current, the fusion portion being disposed in at least one of the electrodes.

According to the invention, the fusion portion is formed in at least one of the two electrodes. With the flow of a greater than predetermined level current through the fusion portion, the fusion portion is fused by heat generated therein, so that the current flow between the two electrodes is interrupted. The power control device of this structure achieves reduction of costs and scale of a circuit incorporating the power control device, as compared to the first example of the prior art wherein the fuse as an external element of the power control device is connected.

Further, the invention is characterized in that in the electrode including the fusion portion to be fused, a cross-sectional area of the fusion portion vertical to a current flow direction is smaller than a sectional area of any other portion of the electrode than the fusion portion.

According to the invention, the fusion portion is formed into the thinnest piece in the electrode by etching a deposited metal, for example. The flow of a greater than predetermined level current through the fusion portion causes the fusion portion to be fused whereby the current flow between the two electrodes is interrupted. The electrode including the fusion portion, as a whole, may be formed of the same material, thus resulting in the reduction of production cost for the power control device.

The invention is characterized in that the fusion portion is coated with a thermoplastic, electric insulating material.

According to the invention, the fusion portion of the electrode is covered by the thermoplastic, electric insulating material such as a resin. More specifically, the flow of a greater than predetermined level current through the fusion portion causes the fusion portion to be fused and the electrode including the fusion portion is divided into parts, whereby the current flow between the two electrodes is interrupted. At the same time, the resin material covering the fusion portion is melted, running into a space between the parts of the electrode thus divided. This provides more reliable interruption of the current flow between the two electrodes with the result of further enhanced reliability of the circuit.

Further the invention is characterized in that the electrode including the fusion portion is formed via an electric insulating layer on the semiconductor chip and composed of:

a pad portion connected to one end of a wire having another end connected to an external terminal;

a contact portion contacting the semiconductor chip; and the fusion portion interconnecting the contact portion and the pad portion.

According to the invention, the electrode with the fusion portion has a structure wherein the pad portion and the contact portion are interconnected by the fusion portion only. With the flow of a greater than predetermined level current through the fusion portion, the fusion portion is fused to disconnect the contact portion from the pad portion and thus, the current flow therebetween is interrupted.

The invention is characterized in that the fusion portion is formed at a shoulder of the electric insulating layer.

According to the invention, the insulating layer of a relatively great thickness is formed atop the semiconductor chip at a predetermined location and then the electrode is formed by, for example, depositing a metal atop the semiconductor chip, the metal deposit spanning the top of the semiconductor chip to the top of the insulating layer. A relatively thin portion of the metal layer covering the shoulder of the insulating layer defines the fusion portion. The flow of a greater than predetermined level current through the fusion portion causes the fusion portion to be fused to disconnect the contact portion from the pad portion thereby shutting down the current flow therebetween. The arrangement allows for the elimination of a step for forming the fusion portion from the fabrication of semiconductor components of a relatively flat structure, such as of the Planar type.

The invention is characterized in that the semiconductor chip is provided with a groove extended along the shoulder.

According to the invention, the electrode is formed by, for example, depositing a metal on the semiconductor chip formed with the groove along the shoulder and a thin portion of the metal film covering the shoulder defines the fusion portion. The flow of a greater than predetermined level current through the fusion portion causes the fusion to be fused to disconnect the contact portion from the pad portion thereby shutting down the current flow therebetween. The arrangement allows for the elimination of a step for forming the fusion portion from the fabrication of semiconductor components including the groove, such as of the Moat type, Mesa type and the like.

The invention is characterized in that:

the electrode including the fusion portion is composed of
  a pad portion connected to one end of a wire having another end connected to an external terminal; a contact portion contacting the semiconductor chip; and the fusion portion for interconnecting the contact portion and the pad portion, the contact portion, an electric insulating layer and the pad portion are sequentially laid in lamination on the semiconductor chip, and a through-hole defining the fusion portion is formed in the electric insulating layer.

According to the invention, in the insulating layer interposed between the contact portion and the pad portion is formed the through-hole defining the fusion portion. The flow of a greater than predetermined level current through the fusion portion causes the fusion portion to be fused to disconnect the contact portion from the pad portion thereby interrupting the current flow therebetween. The arrangement assures that the pad portion, the fusion portion and the contact portion are formed even in a limited electrode area of a semiconductor component.

The invention is characterized in that a plurality of the fusion portions are formed.

According to the invention, each of the fusion portions is formed longer and narrower than a single fusion portion included in the identical semiconductor component and therefore, the fusion portions become more susceptible to the fusion. When one of the multiple fusion portions is fused, a current flowing therethrough is distributed to the remaining fusion portions so that an increased amount of current flows through the remaining fusion portions, thus facilitating the fusion. That is, at each fusion of any one of the fusion portions, the amount of current through the remaining fusion portions is increased in a cumulative basis, so that the fusion portions are fused in succession. Furthermore, in contrast to the semiconductor chip including a single fusion portion, the semiconductor chip including multiple fusion portions allows for the selection of a more fusible width and shape for each fusion portion.

The invention is characterized in that the fusion portion is composed of different parts gathered to be close to one another.

Further, the invention is characterized in that the plurality of the fusion portions are gathered to be close to one another.

According to the invention, the fusion portion extended in a closely bent line, for example, or multiple fusion portions gathered to be close to one another provide the reuse of heat diffused from different parts of the fusion portion(s). More specifically, the heat generated by the fusion portion tends to stay and build up, and accordingly the amount of heat for triggering the fusion which is required in the fusion portion to be generated is smaller with the result that the fusion is facilitated. Furthermore, the fusion portion is reduced in not only the heat release value but also the resistance value, thus drawing a reduced amount of power during the normal operation.

BRIEF DESCRIPTION OF THE DRAWINGS

Other and further objects, features, and advantages of the invention will be more explicit from the following detailed description taken with reference to the drawings wherein:

FIG. 1A is a plan view showing a first embodiment of the semiconductor component constituting the power control device in accordance with the invention, whereas

FIG. 2A is a partial enlarged view showing a fusion portion of FIG. 1 before fused, whereas

FIG. 6A is a plan view showing a third embodiment of the semiconductor component constituting the power control device in accordance with the invention, whereas

FIG. 8A is a partial enlarged view showing a fusion portion before fused according to a fifth embodiment of the invention, whereas

FIG. 11A is a plan view showing an eighth embodiment of the semiconductor component in accordance with the invention, whereas

FIG. 14A is a front elevation showing a typical power control device, whereas

FIG. 16A is a plan view showing the first example of the prior-art semiconductor component, whereas

DETAILED DESCRIPTION OF THE PREFERRED EMBODIMENTS

Figure 1A:
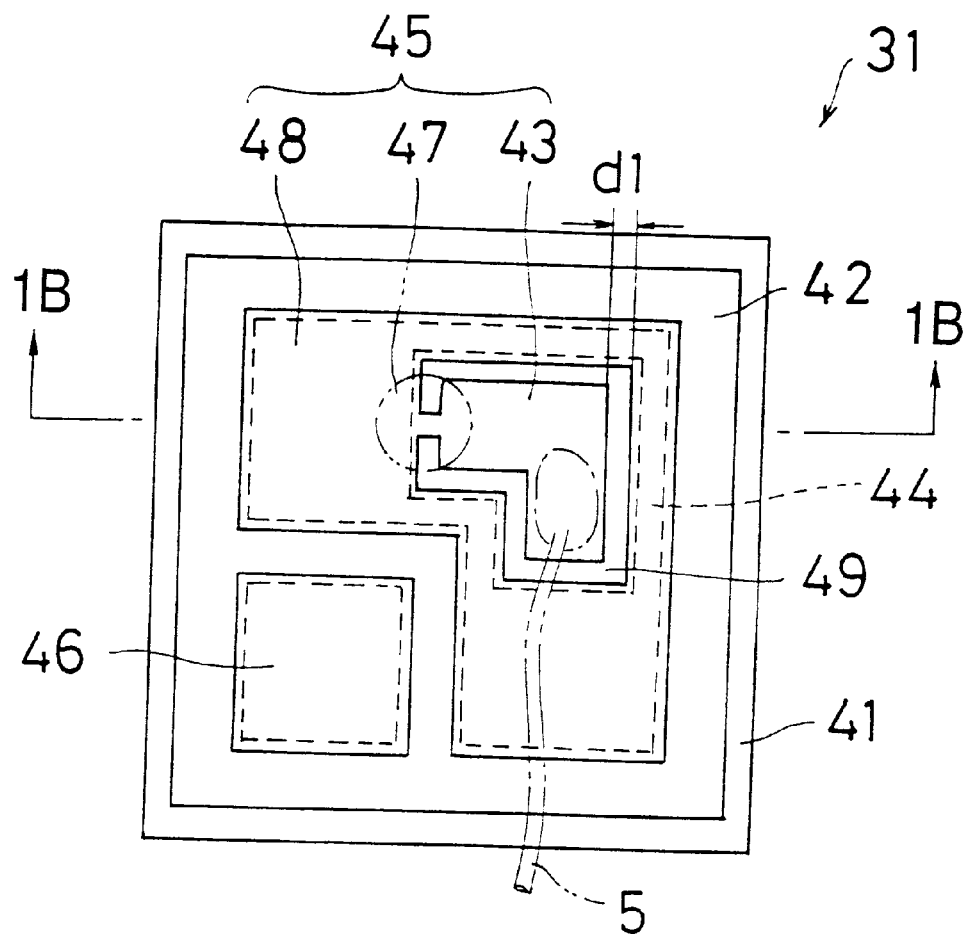

Now referring to the drawings, preferred embodiments of the invention are described below.

Figure 2A:
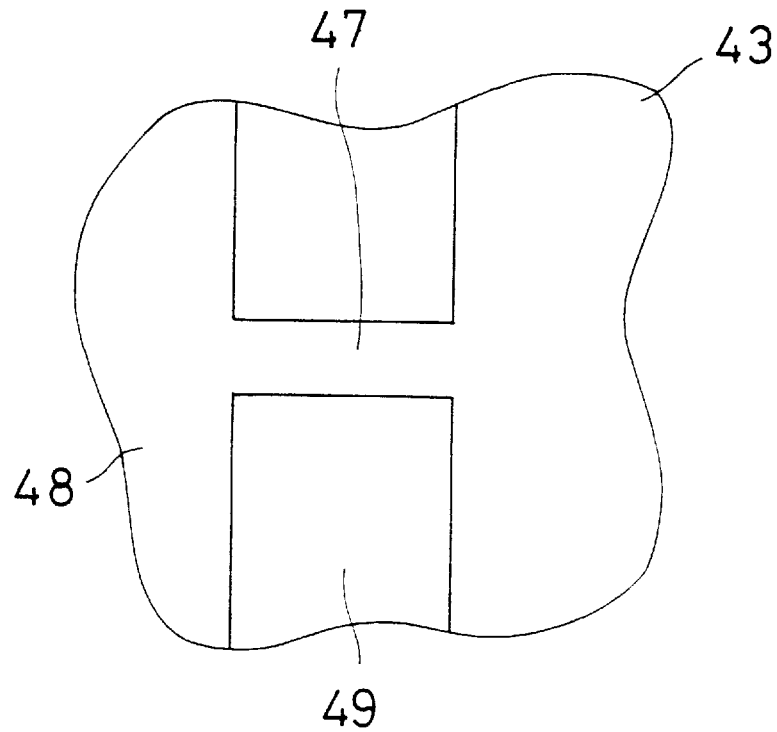
Figure 2B:
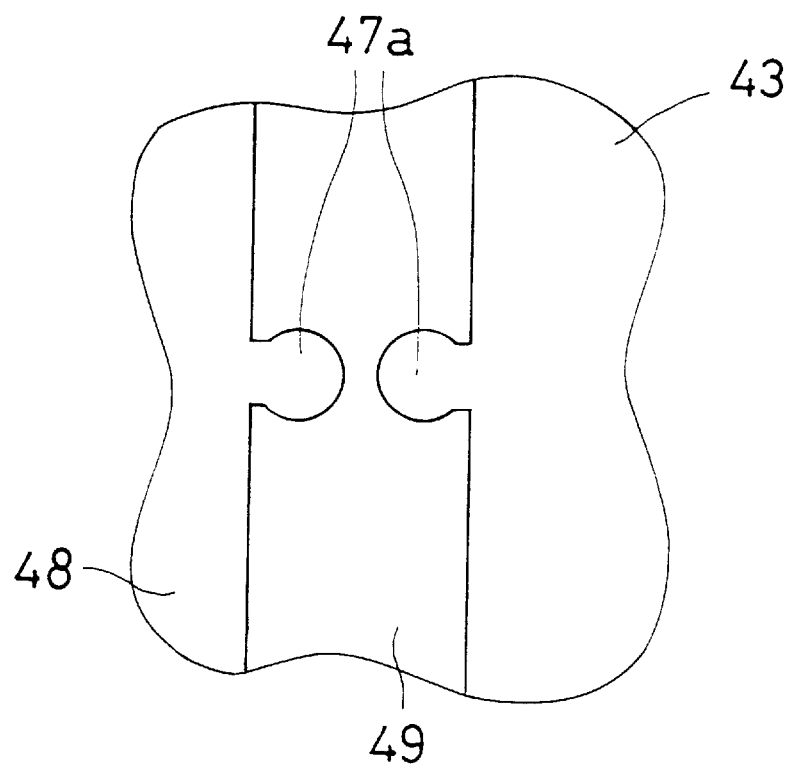
FIG. 2B is a partial enlarged view showing the fusion portion after fused.
Figure 3:
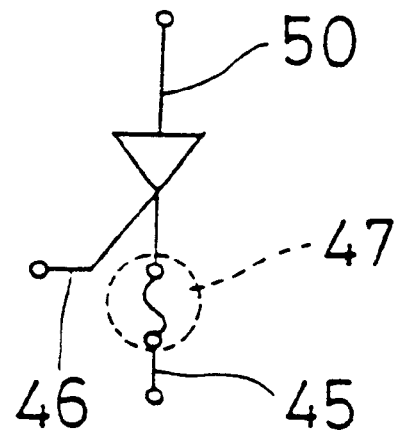
FIG. 3 is a diagram showing an equivalent circuit of the semiconductor component of FIG. 1.
Figure 4:
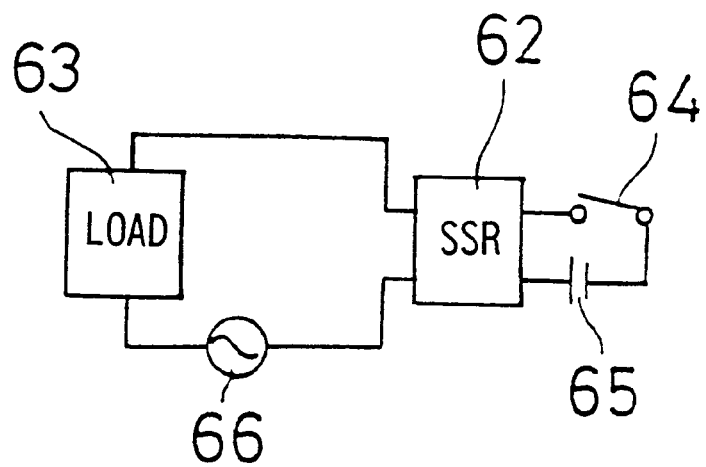
FIG. 4 is a circuit diagram showing a circuit employing a power control device comprising the semiconductor component of FIG. 1.
Figure 14A:
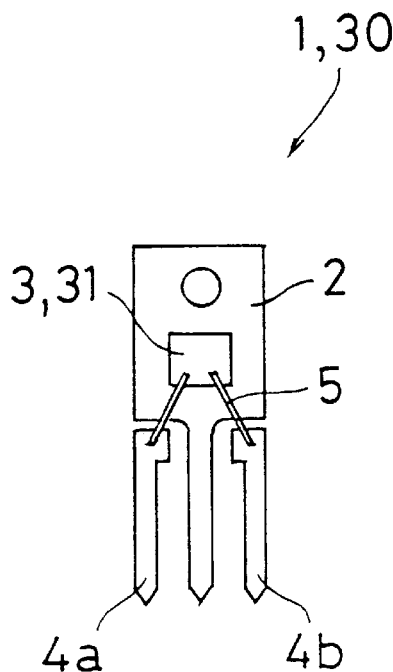
Figure 14B:
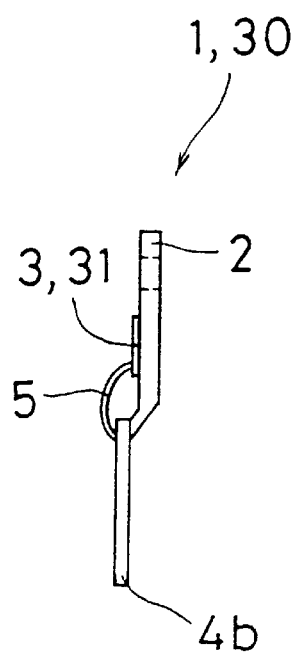
FIG. 14B is a side elevation thereof.

FIGS. 1 to 4 illustrate a first embodiment of the invention; FIG. 1A is a plan view showing a semiconductor component 31 constituting a power control device 30 and FIG. 1B is a sectional view thereof taken on line 1B—1B in FIG. 1A. FIGS. 2 to 4 will be described later. The control device 30 comprises the semiconductor component 31 in the place of the semiconductor component 3 of FIG. 14.

As seen in FIG. 1, laid over a semiconductor chip 41 constituting the semiconductor component 31 are a p1 layer 51, an n1 layer 52, a p2 layer 53 and an n2 layer 54 in lamination. P-type impurities are diffused in the p1 and p2 layers 51, 53 such that a small number of holes are contained therein. N-type impurities are diffused in the n1 and n2 layers 52, 54 such that a small number of free electrons are contained therein. The top of the semiconductor chip 41 is covered by a masking oxide film portion 42. The oxide film portion 42 is formed with a cathode window for allowing a cathode 45 to contact the n2 layer 54 and a gate window for allowing a gate 46 to contact the p2 layer 53. At a corner of the top surface of the square semiconductor chip 41 (at the lower left corner as seen in FIG. 1A), there is disposed the square gate window of a smaller size than the semiconductor chip, whereas the cathode window occupies a substantially L-shaped portion of the top surface of the semiconductor chip 41 that excludes the gate window. The cathode window is defined so as to preserve a smaller L-shaped portion therein which defines a pad base 44. The L-shaped pad base 44 thus preserved is a part of the oxide film portion 42 and isolated from the rest of the oxide film as enclosed by the cathode window. The pad base 44 serves as the base for a pad portion 43 of the cathode 45, which pad portion is subject to the wire bonding.

Figure 1B:
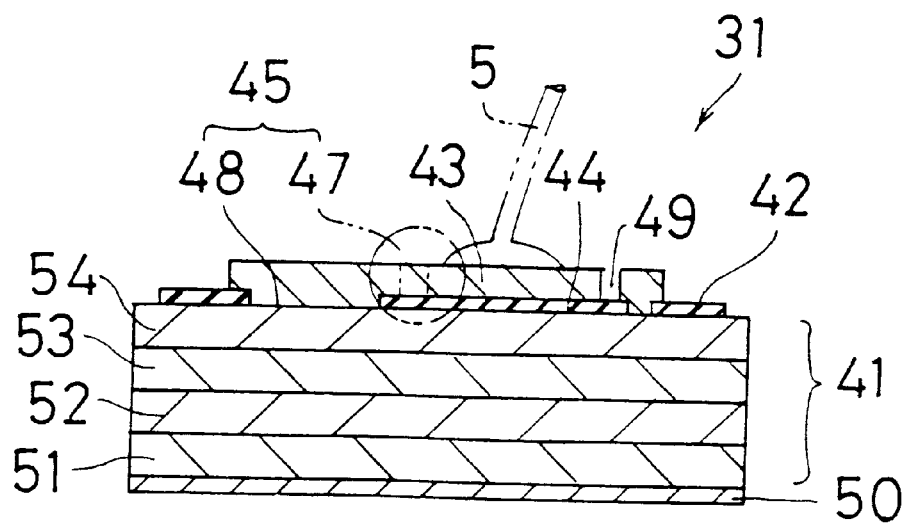
FIG. 1B is a sectional view thereof taken on line 1B—1B in FIG. 1A.

The cathode window is filled with aluminum to form the cathode 45 whereas the gate window is filled with aluminum to form the gate 46. As shown in FIG. 1B, the n2 layer 54 beneath the cathode 45 is positioned at the top of the semiconductor chip 41 whereas, although not shown in the figure, the p2 layer 53 beneath the gate 46 is positioned at the top of the semiconductor chip 41. That is, the cathode 45 filling the cathode window contacts the n2 layer therebeneath or at the top of the semiconductor chip 41 whereas the gate 46 filling the gate window contacts the p2 layer therebeneath or at the top of the semiconductor chip 41. The cathode 45 is formed with the pad portion 43 for connection with a wire, and a fusion portion 47 to be fused by a fusing current. Of the cathode 45, the other portion than the pad portion 43 and fusion portion 47 defines a contact portion 48. The pad portion 43 is disposed atop the pad base 44 and enclosed by a pad groove 49. The contact portion 48 and the pad portion 43 are interconnected by the fusion portion 47 only. The pad groove has a given width d1. The fusion portion 47 is positioned above the center of an edge portion of the L-shaped pad portion 43. The semiconductor chip 41 has its bottom covered by an anode 50 by means of a solderable metal (e.g., Ti—Ni alloy or the like).

An oxide film masking the overall top surface of the semiconductor chip 41 is partially removed by means of etching, for example, so that the cathode window and the gate window are formed and the remaining portion of the oxide film defines the oxide film portion 42. To form the cathode 45 and the gate 46, a metal such as aluminum is deposited atop the semiconductor chip 41 with the oxide film portion 42 laid thereupon and then, the deposited metal is partially removed by means of etching.

At the fusion portion 47, the current flows in either of the directions of from the pad portion 43 to the contact portion 48 or from the contact portion 48 to the pad portion 43. Since the fusion portion 47 has a length equal to the groove width d1 in the direction of the current flow, a value of the fusing current can be determined based on a sectional area of the fusion portion 47 perpendicular to the direction of the current flow and a groove width d1. The groove width d1 varies depending upon the material and shape used for the cathode 45 and gate 46 or the type of packaging of the power control device.

Due to the effect of heat release, the fusing current of the fusion portion 47 is increased to two to three times the fusing current of, for example, a normal aluminum line (in the atmosphere, at room temperatures). Thus, the fusion portion 47 has a sectional area ½ to ⅓ of that of the normal aluminum line, based on which sectional area, the groove width d1 is defined.

The electro-migration occurs in aluminum at a current density ranging from $1 \times 10^5$ A/cm² to $5 \times 10^5$ A/cm². That is, a current having a density smaller than $1 \times 10^5$ A/cm² through the fusion portion 47 does not produce the electro-migration therein. Accordingly, the sectional area of the fusion portion 47 and the groove width d1 may be defined such that the current density does not exceed $1 \times 10^5$ A/cm² for prevention of the occurrence of the electro-migration.

FIG. 2A is a partial enlarged view of the fusion portion 47 before fused in the semiconductor component 31 of FIG. 1, whereas FIG. 2B is a partial enlarged view thereof after fused. With the fusing current through the fusion portion 47, the fusion portion 47 produces heat, which liquefies the fusion portion 47.
The liquefied portion is cleaved as drawn by the surface tension in opposite ways toward the pad portion 43 and toward the contact portion 48 and thus, a fused portion 47a is formed. The fused portion 47a defines separate spherical pieces on both sides, as disabled to draw the current. This results in heat diffusion which causes the spherical fused pieces 47a on both sides to cool down and solidify. The fusion is accomplished in this manner.

Thus, the pad portion 43 is at least partially surrounded by pad groove 49 formed in the electrode (cathode 45). As shown, e.g., in FIG. 1, pad groove 49 is spaced interiorly of a perimeter of the pad base 44. Fusion portion 47 is formed by a discontinuity in the pad groove 49 whereby upon fusion the fusion portion is cut over the pad base 44.

FIG. 3 is a diagram showing an equivalent circuit of the semiconductor component 31 of FIG. 1. The power control device mentioned above includes three electrodes of the cathode 45, gate 46 and anode 50, out of which the cathode 45 is provided with the fusion portion 47. Based on a current across the gate 46, the cathode 45 and anode 50 are switched between in and out of conduction. The flow of the fusing current through the fusion portion 47 causes the fusion portion 47 to be fused, thereby shutting down the current through the cathode 45 and anode 50.

FIG. 4 is a circuit diagram showing a circuit 61 employing the power control device 30. The circuit 61 is adapted for control of heat generated by a load 63 by means of a SSR (Solid State Relay) 62 formed of the combination of multiple types of power control devices of the construction mentioned above.

Upon turning on a switch 64, a voltage from a d.c. source 65 is applied to the SSR 62, which, in turn, either allows or prohibits the flow of an a.c. current through the load 63. The regulation of the a.c. current provides the control of heat generated by the load 63.

Figure 15:
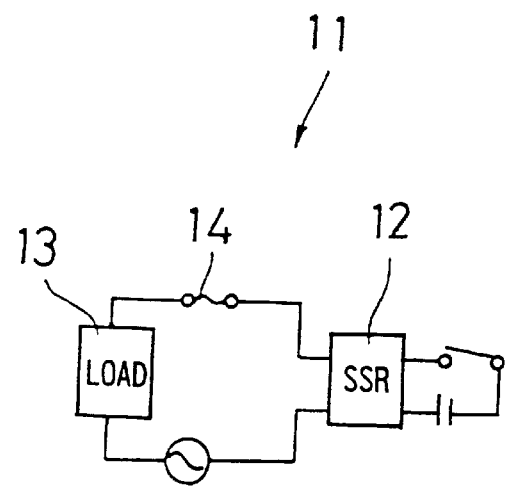
FIG. 15 is a circuit diagram showing a circuit employing a first example of the prior-art power control device.
Figure 16A:
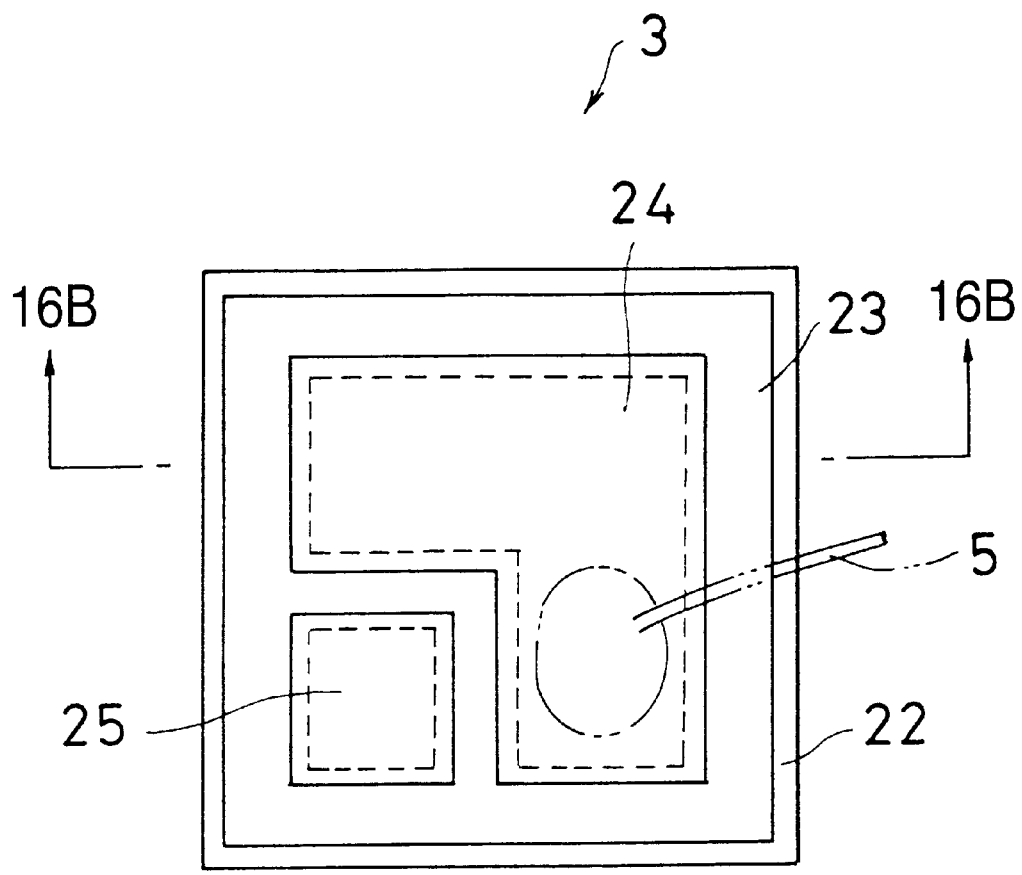
Figure 16B:
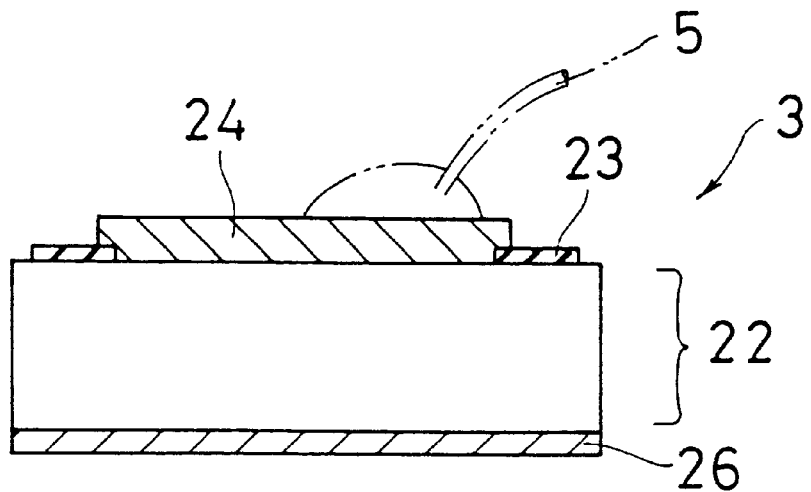
FIG. 16B is a sectional view thereof taken on line 16B—16B in FIG. 16A.

The circuit 61 of FIG. 4 does not require a fuse because the fusion portion 47 is provided at the cathode 45 of the power control device 30 constituting the SSR 62. In contrast to the prior-art circuit 11 shown in FIG. 15, the circuit 61 can be reduced in cost and size.

Figure 5:
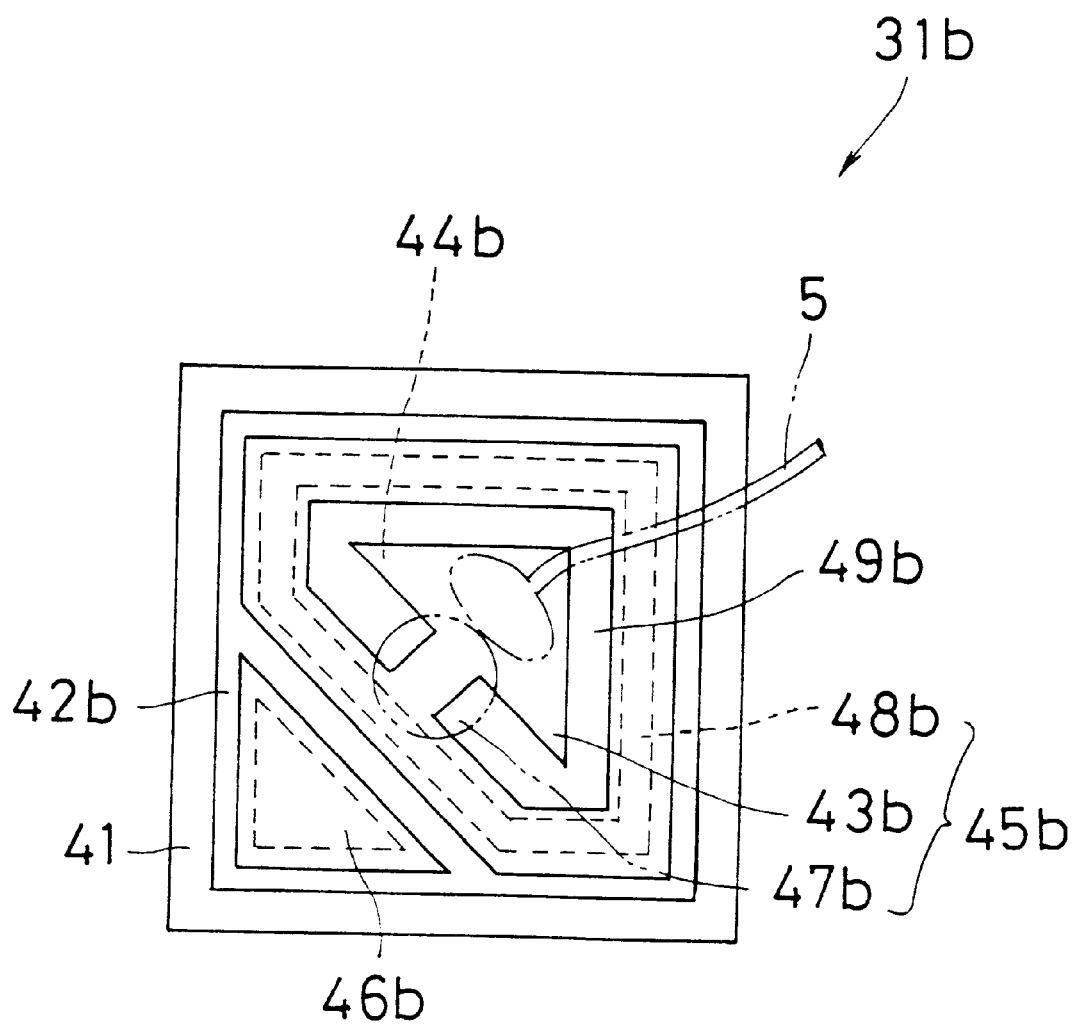
FIG. 5 is a plan view showing a second embodiment of the semiconductor component constituting the power control device in accordance with the invention.

FIG. 5 illustrates a second embodiment of the semiconductor component 31b constituting the power control device according to the invention. The semiconductor component 31b is modified from the semiconductor chip 41 of FIG. 1 in the metallization pattern on the top surface. Disposed on the top surface of the square semiconductor chip 41 is a triangular gate 46b of a size smaller than the semiconductor chip 41. A pentagonal cathode 45b occupies a region on the semiconductor chip 41 that excludes the gate 46b. A triangular pad portion 43b is located inside of the region of the cathode 45b. In correspondence thereto, a suitable oxide film portion 42b, pad base 44b, fusion portion 47b, contact portion 48b and pad groove 49b are formed.

Figure 6A:
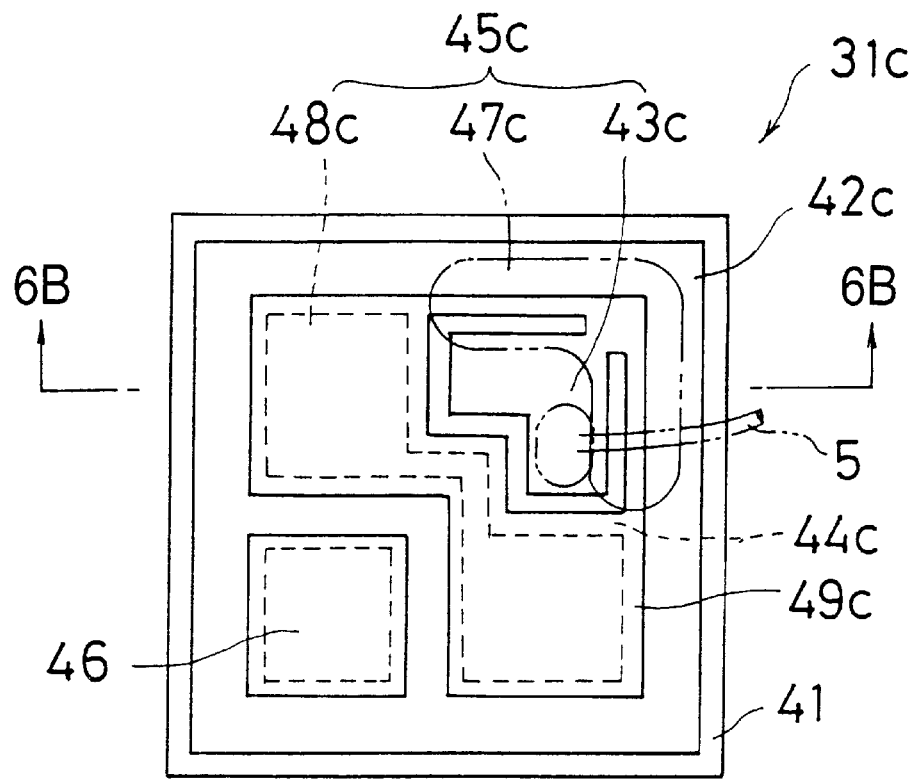
Figure 6B:
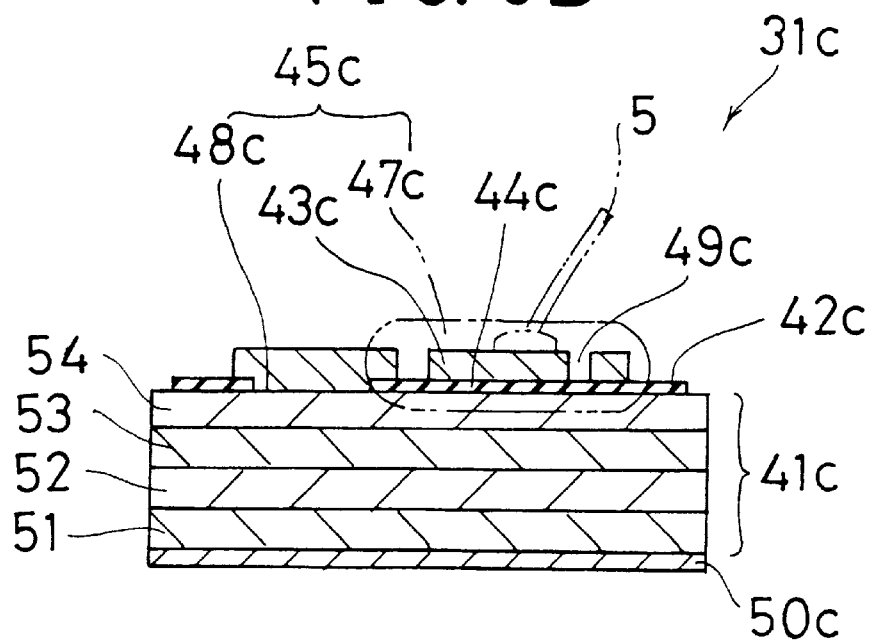
FIG. 6B is a sectional view thereof taken on line 6B—6B in FIG. 6A.

FIG. 6 illustrates a third embodiment of the invention. FIG. 6A is a plan view showing a semiconductor component 31c constituting the power control device whereas FIG. 6B is a sectional view thereof taken on line 6B—6B in FIG. 6A. The semiconductor component 31c is modified from that of FIG. 1 in the arrangement of the pad portion 43 and the fusion portion 47 in the cathode 45. In contrast to the arrangement of FIG. 1 wherein the pad base 44 and the pad portion 43 are located inside of the cathode window, a pad base 44c of FIG. 6 is located at an upper corner of the square region of the semiconductor chip 41 (at an upper right corner as seen in FIG. 6A). A fusion portion 47c is located outside of the center of an L-shaped cathode 45c (at the upper right portion of the cathode 45c, as seen in FIG. 6A). A suitable oxide film portion 42c, pad portion 43c, contact portion 48c and pad groove 49c are formed in correspondence thereto.

The fusion portion 47c of FIG. 6 has a greater length than the fusion portion 47 of FIG. 1 and therefore, is faster to generate heat and to be fused.

Figure 7:
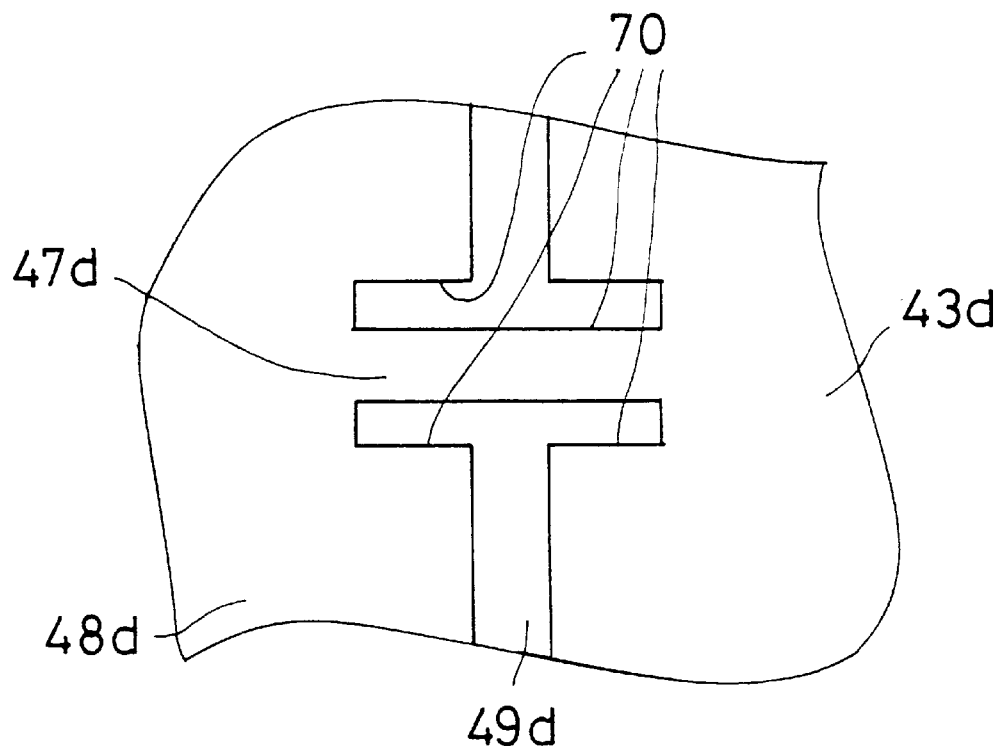
FIG. 7 is a partial enlarged view showing a fusion portion of the power control device according to a fourth embodiment of the invention.

FIG. 7 is a partial enlarged view of a fusion portion 47d before fused in the power control device according to a fourth embodiment hereof. The fusion portion 47d is modified from the fusion portion 47 of FIG. 1 by forming notches 70 at opposite sides thereof in the direction of from the pad portion 43 toward the contact portion 48. The fusion portion 47d of the structure shown in FIG. 7 has a greater length in the direction of from the pad portion 43 toward the contact portion 48, as compared with the fusion portion 47 of FIG. 1. Thus, the fusion portion 47d is faster to generate heat and to be fused.

Figure 8A:
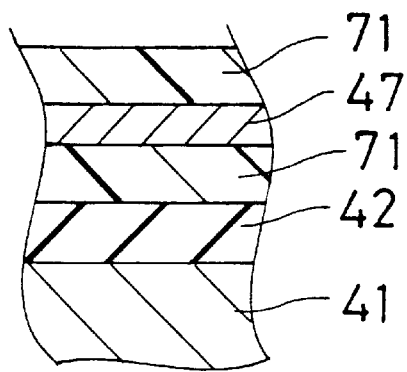
Figure 8B:
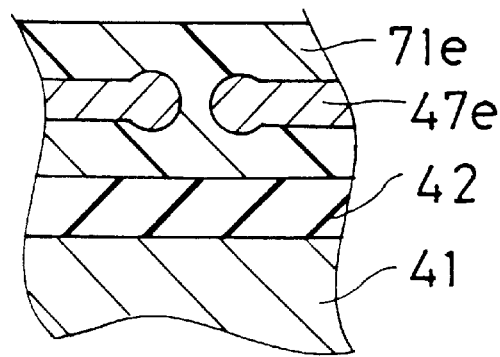
FIG. 8B is a partial enlarged view thereof after fused.

FIG. 8 illustrates a fifth embodiment of the invention. FIG. 8A is a partial enlarged view of the fusion portion 47 before fused in the power control device, whereas FIG. 8B is a partial enlarged view thereof after fused. The fusion portion 47 is sandwiched between resin layers 71 formed of a thermoplastic resin material. The flow of the fusing current through the fusion portion 47 causes the fusion portion 47 to be fused by heat generated therefrom and also causes the fusion of the resin layers 71 adjoining thereto. The fused resin layers 71 fills in a gap between the separated fusion portions and becomes solidified to form a resin layer 71e.

The arrangement of FIG. 8 is adapted for more reliable interruption of the current flow through the fusion portion when it is fused, as compared to the fusion set out in conjunction with FIG. 2.

Figure 9A:
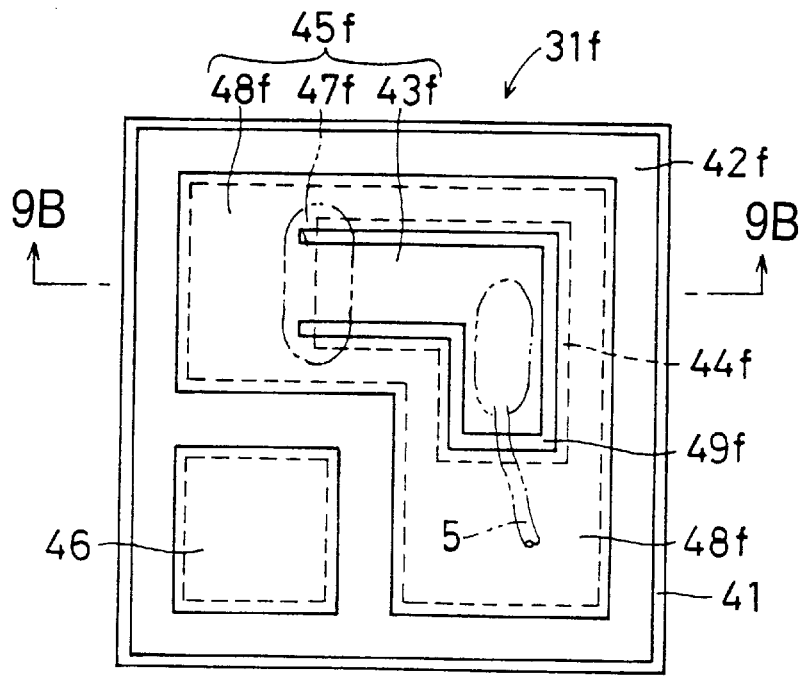
FIG. 9A is a plan view showing a sixth embodiment of the semiconductor component in accordance with the invention, FIG. 9B a sectional view thereof taken on line 9B—9B in FIG. 9A, and FIG. 9C a partial enlarged view thereof.
Figure 9B:
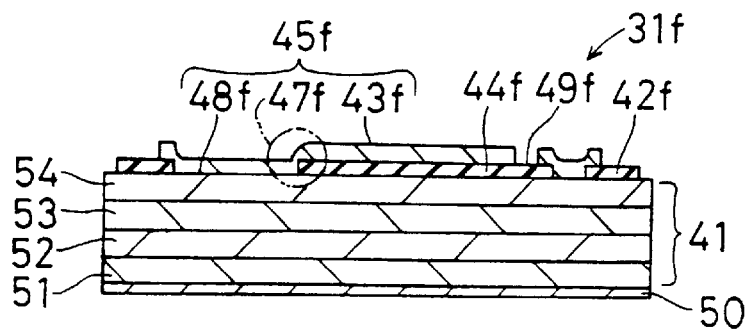
Figure 9C:
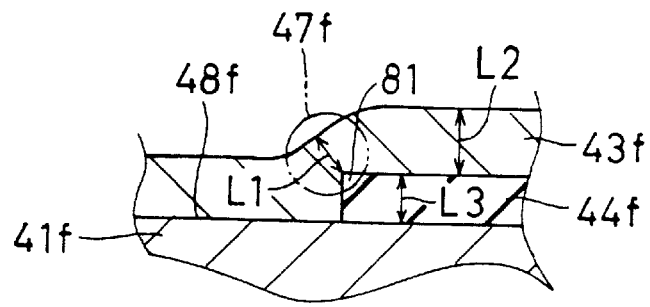

FIG. 9 illustrates a sixth embodiment of the invention; FIG. 9A is a plan view showing a semiconductor component 31f constituting the power control device, FIG. 9B is a sectional view thereof taken on line 9B—9B in FIG. 9A, and FIG. 9C is a partial enlarged view thereof. The semiconductor component 31f is modified by increasing the thickness of the pad base 44 of FIG. 1 and forming the cathode 45 such as to completely cover an end of the L-shaped pad base 44. An insulating layer defining a pad base 44f as the base for a pad portion 43f has a thickness L3 of not smaller than ⅓ of a thickness L2 of a metal layer forming the electrode. The side surface of the pad base 44f is vertical to the top surface of the semiconductor chip 41. A portion of the metal layer covering a shoulder 81 of the pad base 44f has a thickness L1 smaller than the rest, defining a fusion portion 47f. In correspondence thereto, a suitable oxide film portion 42f, cathode 45f, contact portion 48f and pad groove 49f are formed.

The semiconductor component 31f of FIG. 9 for use in the power control device eliminates the need for a special step for forming the fusion portion from the fabrication of a semiconductor component of a relatively flat structure. Accordingly, the semiconductor component of this embodiment is preferably applied to a power control device of a relatively high withstand voltage and small current having a Planar-type semiconductor component or the like, which comprises a passivated oxide film and a thin cathode.

Figure 10A:
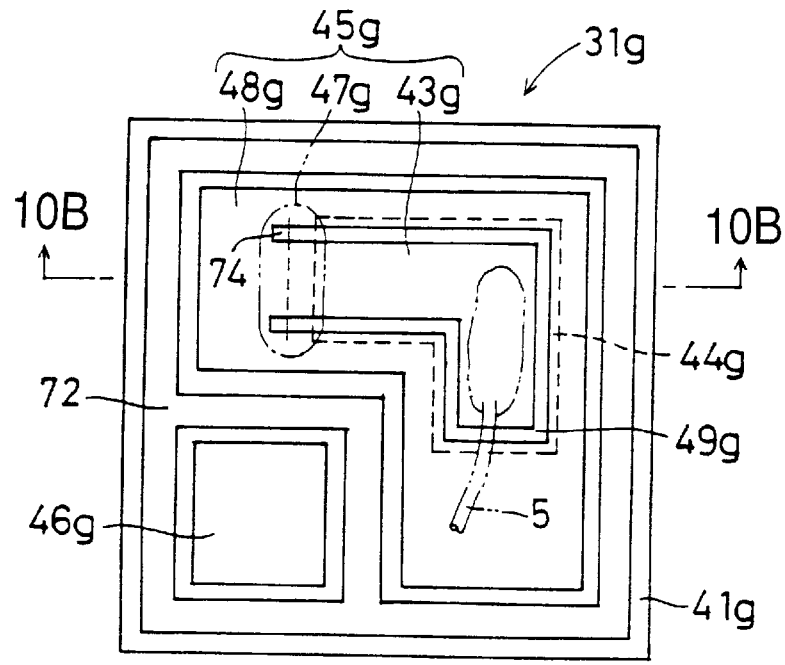
FIG. 10A is a plan view showing a seventh embodiment of the semiconductor component in accordance with the invention, FIG. 10B a sectional view thereof taken on line 10B—10B in FIG. 10A, and FIG. 10C a partial enlarged view thereof.
Figure 10B:
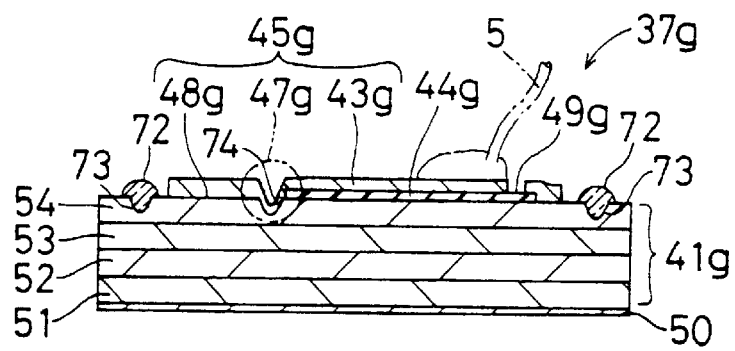
Figure 10C:
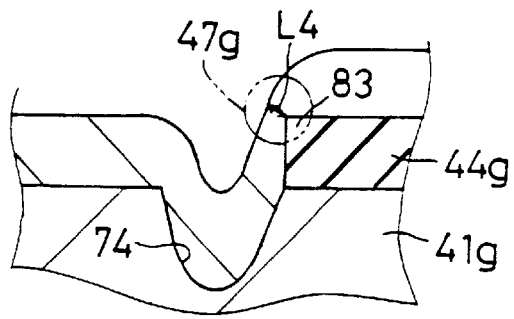

FIG. 10 illustrates a seventh embodiment of the invention. FIG. 10A is a plan view showing a semiconductor component 31g constituting the power control device, FIG. 10B is a sectional view thereof taken on line 10B—10B in FIG. 10A, and FIG. 10C is a partial enlarged view thereof. In the semiconductor component 31g, the oxide film of FIG. 1 defines a pad base 44g only. Atop the semiconductor component 41g, there are formed a passivation groove 73 and a base groove 74. The base groove 74 is formed along a shoulder 83 of the pad base 44g covered by a fusion portion 47g on the semiconductor component 41g. As shown in FIG. 10B and FIG. 10C, base groove 74 extends below a bottom surface of pad base 44b. The shoulder 83 is formed at the perimeter of pad base 44g. A passivation glass 72 for withstanding high voltage is embedded in the passivation groove 73. The fusion portion 47g is so formed as to cover the shoulder 83 of the pad base 44g adjacent to the base groove 74. By virtue of the provision of the base groove 74, the fusion portion 47g has a smaller layer thickness L4 than that L1 of the fusion portion 47f of FIG. 9 and therefore, is more susceptible to the fusion. In correspondence thereto, a suitable pad portion 43g, cathode 45g, contact portion 48g and pad groove 49g are formed.

In the semiconductor component 31g of FIG. 10 constituting the power control device, the base groove 74 for the formation of the fusion portion 47g may be formed concurrently with forming of the passivation groove 73. Thus, this arrangement eliminates the need for a special step for forming the fusion portion from the fabrication of a semiconductor component including multiple grooves on the semiconductor chip 41g. Hence, this embodiment is preferably applied to a power control device of relatively high withstand voltage and large current, which device comprises a semiconductor component such as of the moat- or Mesa-type. Additionally, the embodiment is also preferably applied to a power control device formed by means of the lift-off method for separating an electrode with a great layer thickness, such as a soldered electrode.

Figure 11A:
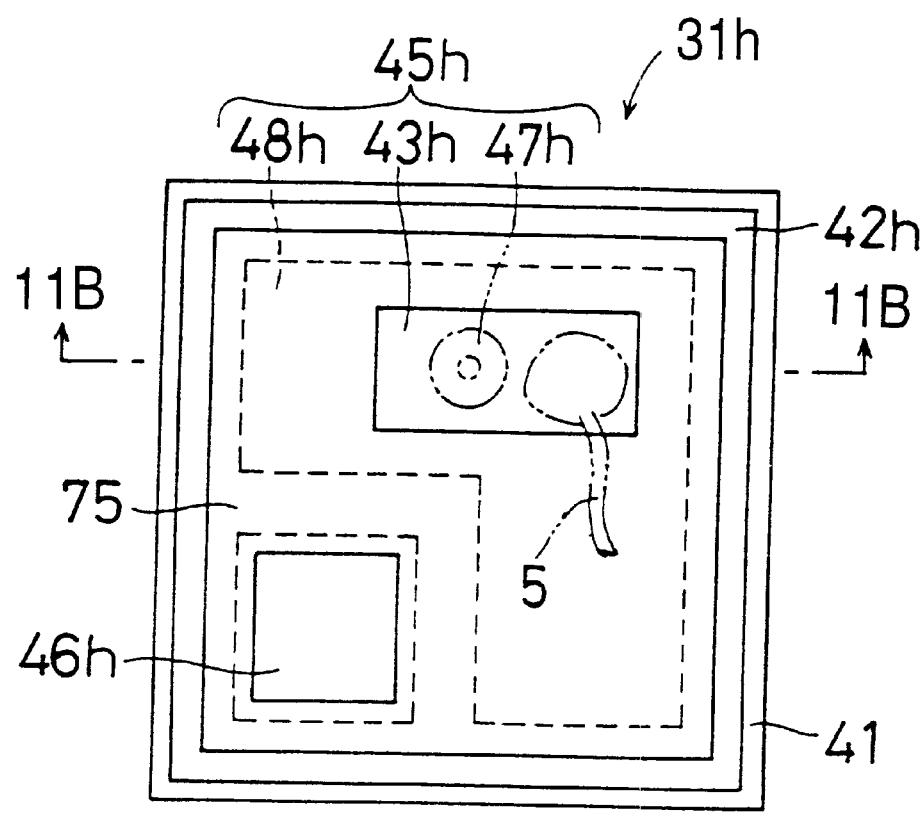
Figure 11B:
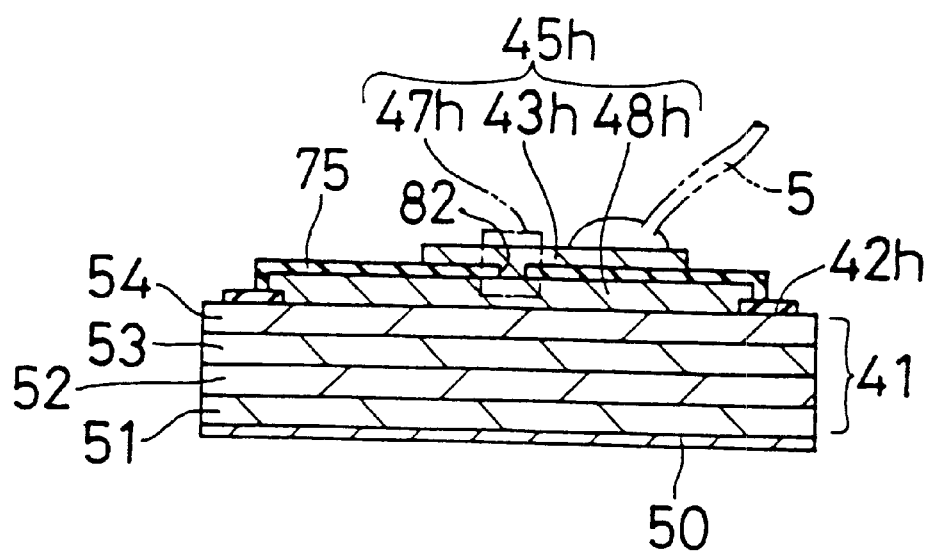
FIG. 11B is a sectional view thereof taken on line 11B—11B in FIG. 11A.

FIG. 11 illustrates an eighth embodiment hereof; FIG. 11A is a plan view showing a semiconductor chip 31h constituting the power control device and FIG. 11B is a sectional view thereof taken on line 11B—11B in FIG. 11A. In the semiconductor chip 31h, a cathode 45h comprises an upper and lower layers wherein the upper layer defines a pad portion 43h and the lower layer defines a contact portion 48h. Interposed between these layers is an insulating layer 75 such as of an electric insulating material. The upper and lower layers are interconnected only by a fusion portion 47h of the cathode 45h, the fusion portion defined by a through hole 82 formed in the insulating layer 75. As shown in FIG. 11B, the fuse portion essentially completely fills the through-whole 82 and is overlaid by the pad portion 43. In correspondence thereto, the respective portions of FIG. 1 are modified and a suitable oxide film portion 42h and gate 46h are formed.

The semiconductor component 31h of FIG. 11 constituting the power control device allows the formation of the contact portion, fusion portion and pad portion even in a limited area of the electrode. Accordingly, the semiconductor component 31h is preferably applied to a power control device with a relatively small electrodes, such as gate turn-off thyristors (GTO) wherein the cathode comprises multiple small portions and the gate comprises multiple portions, the respective portions of the cathode and gate are arranged on an alternating basis.

Figure 12:
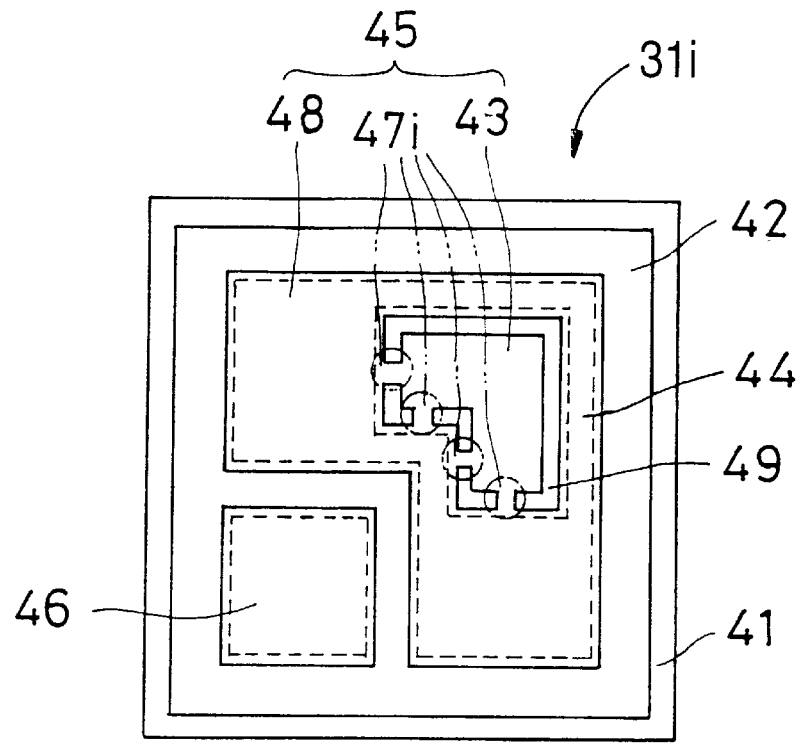
FIG. 12 is a plan view showing a ninth embodiment of the semiconductor component in accordance with the invention.

FIG. 12 is a plan view showing a ninth embodiment of the invention. A semiconductor component 31i of this embodiment is a modification from the semiconductor component 31 of FIG. 1 made by forming a plurality of fusion portions, each of which serves as an independent fusion portion 47i. Each of the fusion portions 47i is formed thinner and longer than the single fusion portion 47 of FIG. 1. As shown in FIG. 12, each fusion portion 47i is one of the discontinuities in the pad groove 49, so that the fusion portion 47 is comprised of plural discontinuities in pad groove 49. Each fusion portion 47i is fused by a similar mechanism to that described in conjunction with FIG. 2 and therefore, the fusion is facilitated by virtue of the thinner and longer shape thereof. Furthermore, each fusion of any one of the fusion portions 47i increases the current through the remaining fusion portions 47i, thus providing successive fusions.

Figure 13:
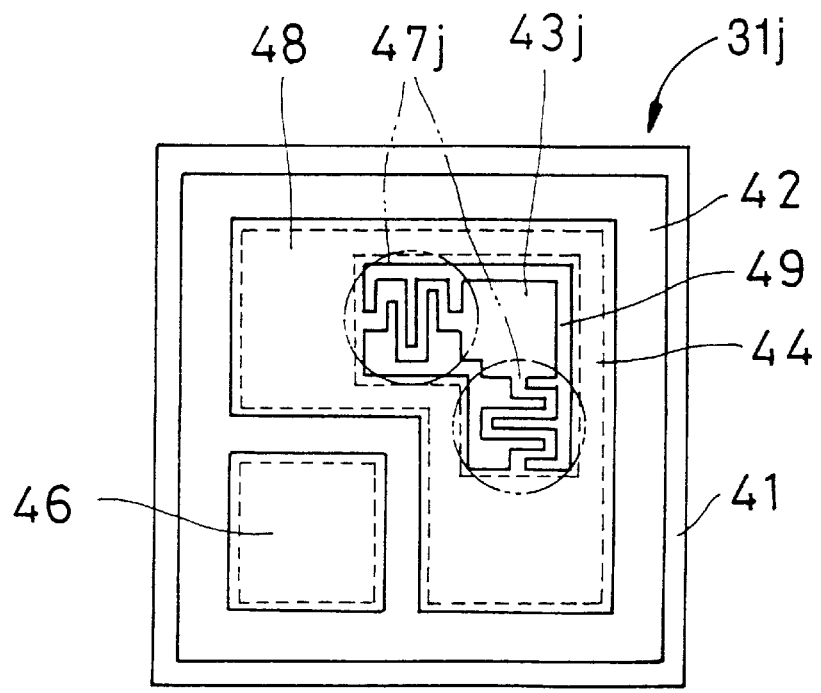
FIG. 13 is a plan view showing a tenth embodiment of the semiconductor component in accordance with the invention.

FIG. 13 is a plan view showing a tenth embodiment of the invention. A semiconductor component 31j of this embodiment is a modification of the semiconductor component 31 of FIG. 1 made by extending a fusion portion 47j in a closely bent line. The fusion portion 47j is composed of different parts gathered to be close to one another, so that heat diffused from one part thereof is given to other parts thereof, thus providing the reuse of the diffused heat among different parts thereof. Furthermore, the thin, long fusion portion 47j may be practiced even in a limited space by assuming a compact bent form. Incidentally, this embodiment may be practiced by means of a plurality of discrete fusion portions gathered close to one another.

The invention may be embodied in other specific forms without departing from the sprit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

What is claimed is:

1. A power control device for controlling a current flowing between two electrodes formed on a semiconductor chip, on the basis of a control signal from an external source, the power control device comprising a fusion portion to be fused by the flow of a greater than predetermined level current, the fusion portion being disposed in at least one of the electrodes, wherein the fusion portion is formed on a shoulder of an electric insulation layer of the semiconductor chip, the shoulder being at a perimeter of a pad comprised of the electric insulation layer; and wherein the semiconductor chip is provided with a groove extending along the shoulder, the groove extending below a bottom surface of the electric insulation layer at the shoulder.

2. The power control device of claim 1, wherein in the electrode including the fusion portion to be fused, a cross-sectional area of the fusion portion vertical to a current flow direction is smaller than a sectional area of any other portion of the electrode than the fusion portion.

3. The power control device of claim 1, wherein the fusion portion is coated with a thermoplastic, electric insulating material.

4. The power control device of claim 1, wherein the electrode including the fusion portion is formed via the electric insulating layer on the semiconductor chip and composed of:

a pad portion connected to one end of a wire having another end connected to an external terminal;

a contact portion contacting the semiconductor chip; and the fusion portion interconnecting the contact portion and the pad portion.

5. A power control device comprising:

a semiconductor chip having at least one semiconductor layer formed thereon;

an insulation layer formed over the semiconductor layer, the insulation layer having an electrode window formed therein;

an electrode formed over the electrode window and over a pad comprised by the insulation layer;

the electrode having a contact portion, a pad portion, and a fusion portion, the contact portion being substantially located over the electrode window, the pad portion being substantially located over the pad comprised of the insulation layer, wherein the fusion portion is comprised of a plurality of fusion isthmuses formed proximate and over at least a portion of a perimeter of the pad comprised by the insulating layer.

6. The power control device of claim 5, wherein the plurality of the fusion isthmuses are arranged close to one another along the perimeter.

7. A power control device comprising:

a semiconductor chip having at least one semiconductor layer formed thereon;

an insulation layer formed over the semiconductor layer, the insulation layer having an electrode window formed therein;

an electrode formed over the electrode window and over a pad comprised by the insulation layer;

the electrode having a contact portion, a pad portion, and a fusion portion, the contact portion being substantially located over the electrode window, the pad portion being substantially located over the pad comprised by the insulation layer, the pad portion being at least partially surrounded by a pad groove formed in the electrode, the pad groove being spaced interiorly of a perimeter of the pad comprised by the insulation layer, and the fusion portion being formed by a discontinuity in the pad groove whereby upon fusion the fusion portion is cut over the pad comprised by the insulation layer.

8. The device of claim 7, wherein the pad comprised by the insulation layer resides within the electrode window.

9. The device of claim 7, wherein the pad comprised by the insulation layer resides at a corner of the electrode window.

10. The device of claim 7, wherein the fusion portion has a thickness which is less than the pad portion and the contact portion.

11. The device of claim 7, wherein a plurality of fusion portions are formed to interconnect the pad portion and the contact portion.

12. The device of claim 7, wherein the fusion portion has a serpentine shape.

13. The device of claim 7, wherein the pad portion is connected to one end of a wire, another end of the wire being connected to an external terminal.

14. A power control device comprising:

a semiconductor chip having at least one semiconductor layer formed thereon;

an insulation layer formed over the semiconductor layer, the insulation layer having an electrode window formed therein;

an electrode formed over the electrode window and over a pad comprised by the insulation layer;

the electrode having a contact portion, a pad portion, and a fusion portion, the contact portion being substantially located over the electrode window, the pad portion being substantially located over the pad comprised by the insulation layer, and the fusion portion interconnecting the contact portion and the pad portion, the fusion portion having a smaller cross-sectional area than the contact portion and the pad portion; the fusion portion being formed between ends of a groove formed in the electrode;

wherein the ends of the groove essentially have a T shape.

* * * * *